United States Patent
Kim et al.

(10) Patent No.: US 9,673,014 B2
(45) Date of Patent: Jun. 6, 2017

(54) METHOD OF MANUFACTURING DISPLAY PANEL

(71) Applicants: Young-Ji Kim, Yongin (KR);
Young-Gu Kim, Yongin (KR);
Hyun-Jun Cho, Yongin (KR);
Hyo-Young Mun, Yongin (KR)

(72) Inventors: Young-Ji Kim, Yongin (KR);
Young-Gu Kim, Yongin (KR);
Hyun-Jun Cho, Yongin (KR);
Hyo-Young Mun, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 175 days.

(21) Appl. No.: 13/930,836

(22) Filed: Jun. 28, 2013

(65) Prior Publication Data
US 2014/0017967 A1    Jan. 16, 2014

(30) Foreign Application Priority Data

Jul. 13, 2012 (KR) .................. 10-2012-0076845
May 21, 2013 (KR) .................. 10-2013-0057292

(51) Int. Cl.
*H01J 9/00* (2006.01)
*G02F 1/1333* (2006.01)

(52) U.S. Cl.
CPC .......... *H01J 9/00* (2013.01); *G02F 1/133351* (2013.01); *G02F 2001/133311* (2013.01); *G02F 2001/133331* (2013.01); *H01L 2227/326* (2013.01)

(58) Field of Classification Search
CPC ............................... G02F 1/133351

USPC ..................................... 445/24, 25
See application file for complete search history.

(56) References Cited

U.S. PATENT DOCUMENTS

| | | | | |
|---|---|---|---|---|
| 2004/0179165 | A1* | 9/2004 | Kinoshita et al. | 349/158 |
| 2004/0195960 | A1* | 10/2004 | Czeremuszkin | C08J 7/045 313/504 |
| 2006/0254704 | A1* | 11/2006 | Seo et al. | 156/249 |
| 2008/0063787 | A1 | 3/2008 | Hong | |
| 2009/0001886 | A1* | 1/2009 | Ibe | H01L 51/5253 313/512 |
| 2009/0227167 | A1* | 9/2009 | Tannas, Jr. | G02F 1/1339 445/2 |

(Continued)

FOREIGN PATENT DOCUMENTS

| | | |
|---|---|---|
| CN | 101144928 A | 3/2008 |
| CN | 100401340 C | 7/2008 |

(Continued)

OTHER PUBLICATIONS

Extended European Search Report dated Oct. 30, 2013.

*Primary Examiner* — Zachary J Snyder
(74) *Attorney, Agent, or Firm* — Lee & Morse, P.C.

(57) ABSTRACT

A method of manufacturing a display panel includes forming a mother panel on a base substrate, attaching an upper passivation film to the mother panel, detaching the base substrate from the mother panel, attaching a lower film to the mother panel, and cutting the mother panel to which the upper passivation film and the lower film are attached to form the display panel, the display panel being in a form of a cell unit. The display panel includes a display substrate, a display device layer, and a thin film encapsulation layer.

27 Claims, 20 Drawing Sheets

(56) References Cited

U.S. PATENT DOCUMENTS

| | | | |
|---|---|---|---|
| 2010/0011925 A1* | 1/2010 | Lim et al. | 83/56 |
| 2010/0210055 A1* | 8/2010 | Yoon et al. | 438/30 |
| 2010/0308335 A1 | 12/2010 | Kim et al. | |
| 2011/0156062 A1 | 6/2011 | Kim et al. | |
| 2011/0159262 A1* | 6/2011 | Negishi | 428/215 |
| 2012/0009702 A1 | 1/2012 | Cho | |
| 2012/0098026 A1 | 4/2012 | Kwack et al. | |

FOREIGN PATENT DOCUMENTS

| | | |
|---|---|---|
| CN | 100428010 C | 10/2008 |
| CN | 101728420 A | 6/2010 |
| CN | 102143842 A | 8/2011 |
| EP | 1 901 111 A2 | 3/2008 |
| JP | 2008-004917 | 1/2008 |
| KR | 10-2004-0002796 A | 1/2004 |
| KR | 10-2007-0027348 A | 3/2007 |
| KR | 10-2010-0130898 A | 12/2010 |
| KR | 10-1019621 B1 | 2/2011 |
| KR | 10-2011-0071540 A | 6/2011 |
| KR | 10-2011-0075363 A | 7/2011 |

* cited by examiner

METHOD OF MANUFACTURING DISPLAY PANEL

CROSS-REFERENCE TO RELATED APPLICATIONS

Korean Patent Application No. 10-2012-0076845 filed on Jul. 13, 2012, in the Korean Intellectual Property Office, and entitled: "METHOD OF MANUFACTURING DISPLAY PANEL," is incorporated by reference herein in its entirety.

Korean Patent Application No. 10-2013-0057292 filed on May 21, 2013, in the Korean Intellectual Property Office, and entitled: "METHOD OF MANUFACTURING DISPLAY PANEL," is incorporated by reference herein in its entirety.

BACKGROUND

1. Field

Example embodiments relate to a method of manufacturing a display panel.

2. Description of the Related Art

Display devices include liquid crystal displays (LCD), plasma display panels (PDP), organic light emitting diode (OLED) displays, field effect displays (FED), and electrophoretic display devices.

SUMMARY

Embodiments are directed to a method of manufacturing a display panel including forming a mother panel on a base substrate, attaching an upper passivation film to the mother panel, detaching the base substrate from the mother panel, attaching a lower film to the mother panel, and cutting the mother panel to which the upper passivation film and the lower film are attached to form the display panel, the display panel being in a form of a cell unit, wherein the display panel includes a display substrate, a display device layer, and a thin film encapsulation layer.

The upper passivation film may initially include a carrier film, an adhesive layer formed on a lower portion of the carrier film, and a release film attached to a lower portion of the adhesive layer. The method may include removing the release film to attach the adhesive layer to the thin film encapsulation layer.

The carrier film may be formed of any one of polyethylene terephthalate, polyethylene naphthalate, polyethylene sulfide, and polyethylene.

The carrier film may have a thickness of about 25 to 300 μm.

The adhesive layer may have adhesion strength of about 1 to 50 gf/inch when stainless steel (SUS) is an adherent.

The adhesive layer may be a silicone, acrylic, or urethane-based film.

The upper passivation film may initially includes a first carrier film, a first adhesive layer formed on a lower portion of the first carrier film lower, a second carrier film formed on a lower portion of the first adhesive layer, a second adhesive layer formed on a lower portion of the second carrier film, and the release film attached to a lower portion of the second adhesive layer. The method may further include removing the release film to attach the second adhesive layer to the thin film encapsulation layer.

The first carrier film and the second carrier film may be formed of any one of polyethylene terephthalate, polyethylene naphthalate, polyethylene sulfide, and polyethylene.

The second carrier film may have a thickness of about 25 to 300 μm.

The second adhesive layer may have an adhesion strength of about 1 to 50 gf/inch when stainless steel (SUS) is an adherent.

The first adhesive layer and the second adhesive layer may each individually be a silicone, acrylic, or urethane-based film.

An adhesion strength of the first adhesive layer may be the same as or smaller than the adhesion strength of the second adhesive layer.

The method may further include forming a hard coating layer on an upper portion of the upper passivation film.

The hard coating layer may have a thickness of about 3 to 4 μm.

The hard coating layer may be formed by applying an acryl-based urethane onto the upper portion of the upper passivation film and then performing ultraviolet (UV) curing.

The display substrate may be a flexible substrate.

The upper passivation film may be formed of a transparent material.

The method may further include removing the upper passivation film from the thin film encapsulation layer of the display panel in the form of the cell unit, and attaching a functional layer to the thin film encapsulation layer.

The functional layer may be a polarizer.

The functional layer may be a touch screen panel.

The functional layer may be a light efficiency or brightness increasing film.

The upper passivation film may initially includes a functional layer, a functional layer passivation film formed on an upper portion of the functional layer, an adhesive layer formed on a lower portion of the functional layer, and a release film attached to the lower portion of the adhesive layer. The method may further include removing the release film to attach the adhesive layer to the thin film encapsulation layer.

The adhesive layer may have an adhesion strength of about 0.2 to 2 kgf/inch when stainless steel is an adherent.

The method may further include, before attaching the upper passivation film to the mother panel, performing half-cutting such that the functional layer, the adhesive layer, and the release film remain on a cell outskirt portion other than a surface on which the display device layer is formed.

The method may further include, after cutting the mother panel to form the display panel in the form of the cell unit, removing upper passivation film, the functional layer, the adhesive layer and the release film from the cell outskirt portion, and the adhesive layer from the cell outskirt portion.

The removing of the cell outskirt portion upper passivation film may be performed such that end surfaces of the functional layer corresponding to the surface on which the display device layer is formed and the adhesive layer coincide with an end surface of the display device layer.

The functional layer may be a polarizer.

The functional layer may be a touch screen panel.

The functional layer may be a light efficiency or brightness increasing film.

The upper passivation film may further include a dummy passivation film on the functional layer passivation film.

An adhesion strength of the adhesive layer may be changed by ultraviolet rays (UV).

BRIEF DESCRIPTION OF THE DRAWINGS

Features will become apparent to those of skill in the art by describing in detail example embodiments with reference to the attached drawings in which.

DETAILED DESCRIPTION

Figure 1:
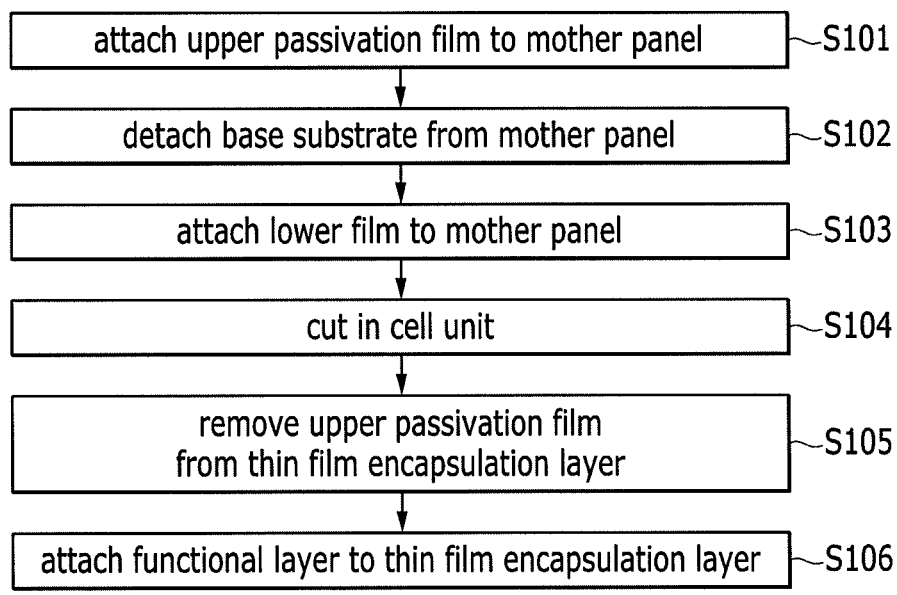
FIG. 1 illustrates a flowchart showing a method of manufacturing a display panel according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, a method of manufacturing a display panel according to an exemplary embodiment will be described with reference to FIGS. 1 and 2A to 2F.

FIG. 1 illustrates a flowchart showing a method of manufacturing a display panel according to an exemplary embodiment. In the following description, reference characters S101 through S106, referring to stages illustrated in the flowchart, are in parentheses. FIGS. 2A to 2F are process views showing stages of the method of manufacturing the display panel according to the exemplary embodiment.

Referring to FIGS. 1 and 2A to 2F, first, a mother panel 100 including a display substrate 40, a display device layer 50 formed on the display substrate 40, and a thin film encapsulation layer 30 formed on the display device layer 50 may be provided on a base substrate 20. The base substrate 20 attached to the display substrate 40 may provide sufficient thickness to enable convenient handling of the mother panel 100. The display substrate 40 may be a flexible polyimide (PI) substrate. It is to be understood that the mother panel 100 may include a plurality of display device layers 50 and corresponding thin encapsulation layers 30 spaced apart from each other on the display substrate 40.

The display device layer 50 may be an organic light emitting display device layer. The thin film encapsulation layer 30 may be formed as an organic and inorganic complex layer by alternately laminating one or more organic layers and one or more inorganic layers. The entire display device layer 50 may be covered by the thin film encapsulation layer 30 to be protected from the external air. In FIGS. 1 through 3, the thin film encapsulation layer 30 is illustrated schematically.

The display substrate 40 may be manufactured using a melt-extrusion method of performing biaxial stretching after melting to manufacture a substrate, or using a solvent caster method of mixing and dissolving additives and plastics to ensure fluidity and then passing the resulting structure through a slit die having a fixed thickness to volatilize a solvent, thus molding a plastic substrate.

Figure 2A:
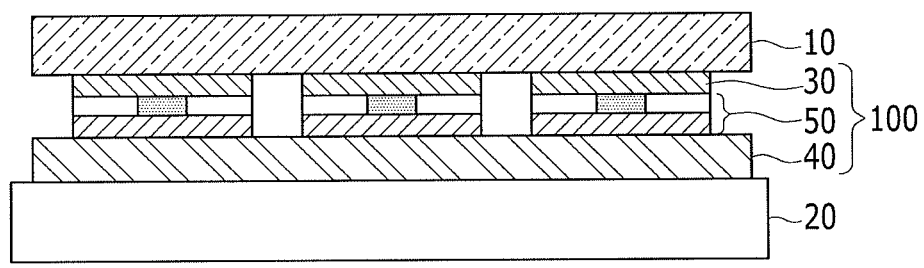
FIGS. 2A to 2F illustrate process views showing stages of the method of manufacturing the display panel according to the exemplary embodiment.
Figure 3:
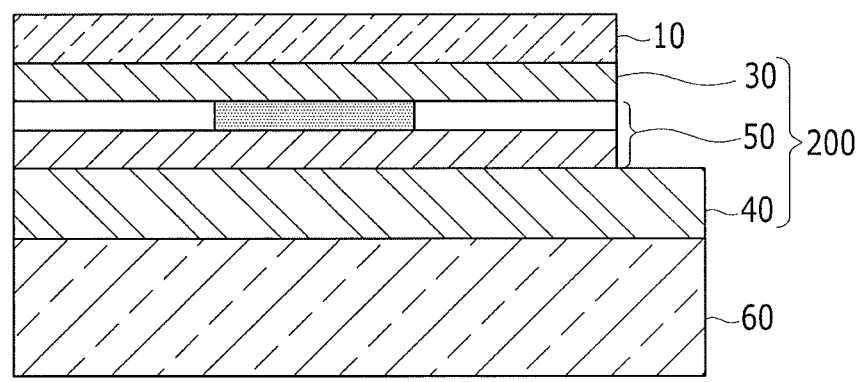
FIG. 3 illustrates a cross-sectional view showing a unit display panel cut into a cell unit, to which an upper passivation film is attached, according to the exemplary embodiment.
Figure 4:
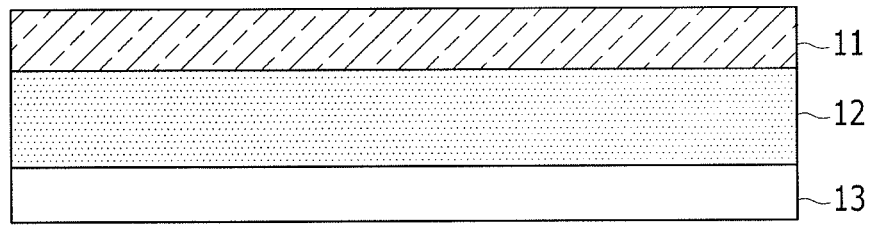
FIG. 4 illustrates a cross-sectional view of the upper passivation film according to the exemplary embodiment.

As shown in FIG. 2A, the upper passivation film 10 according to the exemplary embodiment may be attached to the thin film encapsulation layer 30 of the mother panel 100 (S101). As shown in FIG. 4, the upper passivation film 10 may initially be made up of a carrier film 11, an adhesive layer 12, and a release film 13. After the release film 13 is removed, the adhesive layer 12 may be attached to the thin film encapsulation layer 30.

Figure 2B:
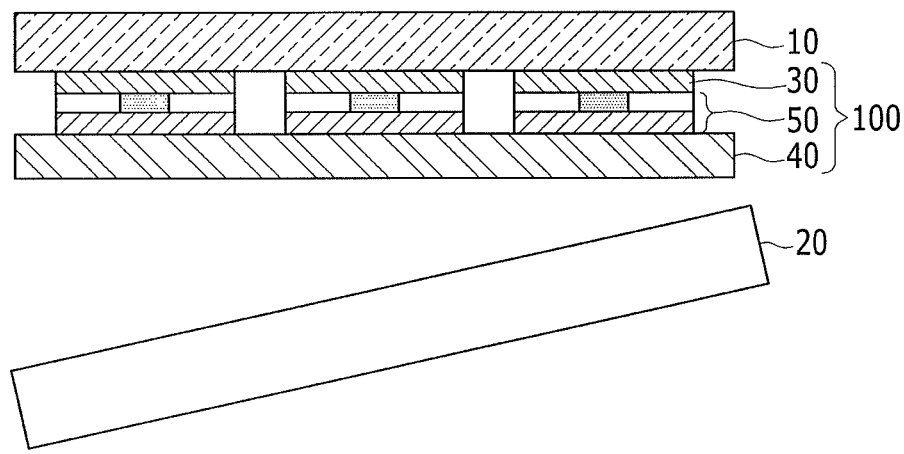

As shown in FIG. 2B, the base substrate 20 may be detached from the display substrate 40 of the mother panel 100 (S102).

Figure 2C:
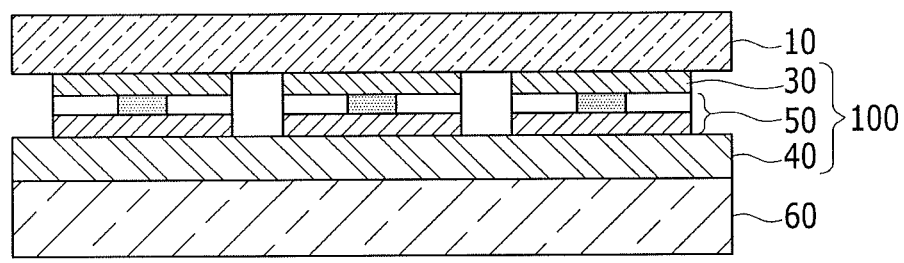

As shown in FIG. 2C, after the base substrate 20 is detached, a lower film 60 is attached to the display substrate 40 of the mother panel 100 (S103). The lower film 60 is attached to the display substrate 40 to prevent or hinder a surface of the display substrate 40 from being damaged when a subsequent process is performed.

Figure 2D:
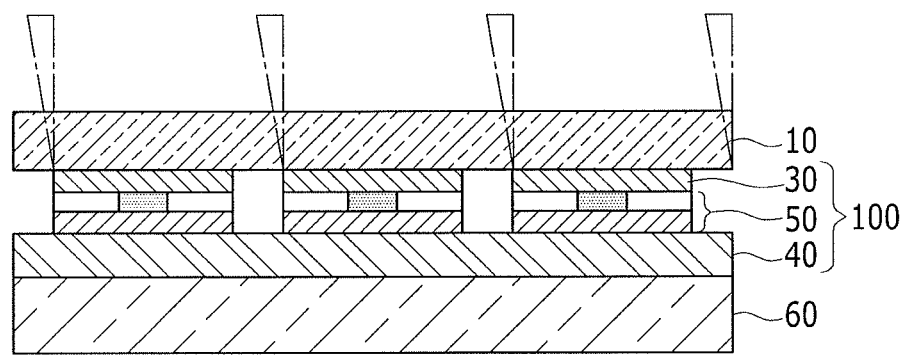

As shown in FIG. 2D, the mother panel 100 to which the upper passivation film 10 and the lower film 60 are attached is cut to provide a unit display panel 200 (S104). The cell cutting may be performed using a method such as laser cutting or cutting by a physical unit (e.g., knife). Thereby, a unit display panel 200 according to the exemplary embodiment shown in FIG. 3 is manufactured.

Figure 2E:
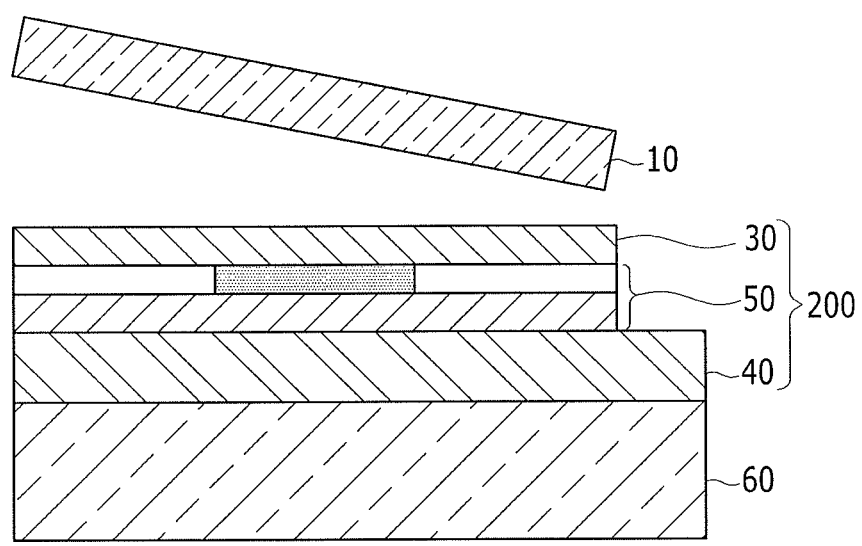
Figure 2F:
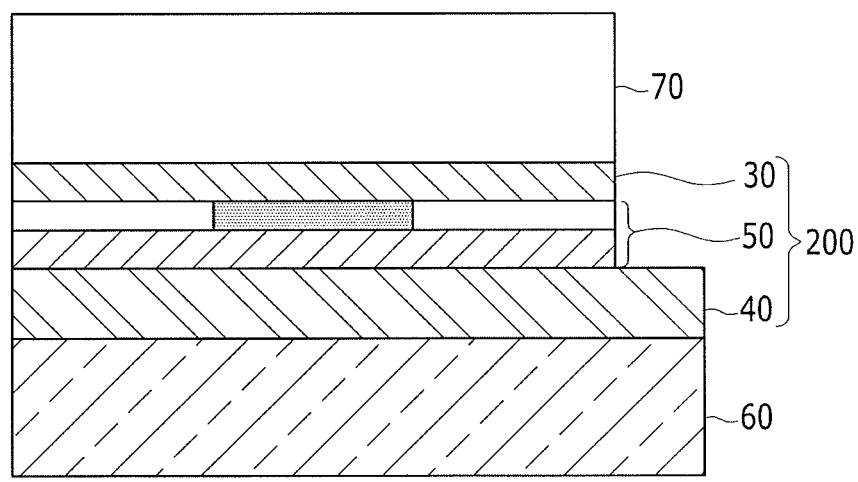

The method of manufacturing the display panel according an embodiment, as shown in FIGS. 2E and 2F, may further include removing the upper passivation film 10 from the thin film encapsulation layer 30 of the unit display panel 200 cut in the cell unit (S105) and attaching a functional layer 70 to the thin film encapsulation layer 30 (S106).

FIG. 3 illustrates a cross-sectional view showing the unit display panel 200 cut into the form of a cell unit, to which the upper passivation film is attached, according to the exemplary embodiment. Referring to FIG. 3, the unit display panel 200 includes the display substrate 40, the display device layer 50, and the thin film encapsulation layer 30. The upper passivation film 10 is attached to the thin film encapsulation layer 30, and the lower film 60 is attached to the display substrate 40.

The unit display panel 200 may be a liquid crystal display panel including liquid crystal, or an organic light emitting panel including an organic light emitting portion. The display substrate 40 may be a transparent substrate, and/or a flexible substrate such as a polymer film. The display device layer 50 may be formed on the display substrate 40, and may include a device region, in which an active device such as a thin film transistor (TFT) is formed, and a light emitting region, in which an emission layer is formed. The thin film encapsulation layer 30 is formed on the display device layer 50, and faces the display substrate 40. The thin film encapsulation layer 30 may prevent or hinder an inflow of oxygen and moisture from the outside to protect the display device layer 50.

The thin film encapsulation layer 30 may be formed by alternately laminating one or more organic layers and one or more inorganic layers.

The inorganic layer or the organic layer may be each provided in plural.

The organic layer may be formed of a polymer, and may be, for example, a single layer or a laminated layer formed of any one of polyethylene terephthalate, polyimide, polycarbonate, epoxy, polyethylene, and polyacrylate. For example, the organic layer may be formed of polyacrylate, and may include a material obtained by polymerizing a monomer composition including a diacrylate-based monomer and a triacrylate-based monomer. A monoacrylate-based monomer may be further included in the monomer composition. Further, a suitable photoinitiator such as TPO may be further included in the monomer composition, for example.

The inorganic layer may be a single layer or a laminated layer including metal oxide or metal nitride. For example, the inorganic layer may include any one of $SiN_x$, $Al_2O_3$, $SiO_2$, and $TiO_2$.

The uppermost layer of the thin film encapsulation member 30, which is exposed to the outside, may be formed of an inorganic layer in order to prevent or hinder permeation of moisture to an organic light emitting device.

The thin film encapsulation member 30 may include at least one sandwich structure in which at least one organic layer is inserted between at least two inorganic layers. In an implementation, the thin film encapsulation member 30 may include at least one sandwich structure in which at least one inorganic layer is inserted between at least two organic layers.

The thin film encapsulation layer 30 may include a first inorganic layer, a first organic layer, and a second inorganic layer sequentially disposed from an upper portion of the display device layer 50. In an implementation, the thin film encapsulation layer 30 may include the first inorganic layer, the first organic layer, the second inorganic layer, a second organic layer, and a third inorganic layer sequentially disposed from the upper portion of the display device layer 50. In an implementation, the thin film encapsulation layer 30 may include the first inorganic layer, the first organic layer, the second inorganic layer, the second organic layer, the third inorganic layer, a third organic layer, and a fourth inorganic layer sequentially disposed from the upper portion of the display device layer 50.

A halogenated metal layer including LiF may be further included between the display device layer 50 and the first inorganic layer. The halogenated metal layer may prevent or hinder the display device layer 50 from being damaged when the first inorganic layer is formed by a sputtering method or a plasma deposition method.

The first organic layer may have an area that is smaller than that of the second inorganic layer. The second organic layer may have an area that is smaller than that of the third inorganic layer. The first organic layer may be completely covered by the second inorganic layer. The second organic layer may be completely covered by the third inorganic layer.

The upper passivation film 10 is attached to the thin film encapsulation layer 30.

The upper passivation film 10 may protect the thin film encapsulation layer 30. The thin film encapsulation layer 30 may be a thin film having a small thickness, and may cover an organic light emitting material constituting the display device layer 50. With regard to the thin film encapsulation layer 30, damage such as stabbing or scratches may easily occur. For example, damage may be produced by an alien substance generated by external scratching or when an additional process, such as a cell cutting process, is performed. Such damage may result in noticeable defects such as dark spots on the display. When the upper passivation film 10 is used in order to prevent or reduce the likelihood of damage to the thin film encapsulation layer 30, the upper passivation film 10 may protect the surface of the thin film encapsulation layer 30 when the additional process is performed. Accordingly, limitations that may otherwise be imposed to protect the thin film encapsulation layer 30 may be removed or disregarded if the upper passivation film 10 is present when the additional process is performed.

The upper passivation film may 10 be formed of a transparent material.

Inspection of the unit display panel 200 may be performed when a transparent film is used as the upper passivation film 10. Further, process marks may be confirmed in equipment, and thus, limitations with respect to equipment/methods for performing of the additional process may be reduced.

The lower film 60 may be attached to the display substrate 40, and prevents the surface of the display substrate 40 from being damaged when the process is performed.

FIG. 4 illustrates a cross-sectional view of the upper passivation film 10 according to the exemplary embodiment. Referring to FIG. 4, the upper passivation film 10 may initially include the carrier film 11, the adhesive layer 12, and the release film 13.

The release film 13 may be a protection paper for preventing the adhesive layer 12 from coming into contact with contaminants and with the outside. The release film 13 is removed before the upper passivation film 10 is attached to the thin film encapsulation layer 30 to attach the adhesive layer 12 to the thin film encapsulation layer 30.

The carrier film 11 may be formed of any one of polyethylene terephthalate (PET), polyethylene naphthalate (PEN), polyethylene sulfide (PES), and polyethylene (PE).

The carrier film 11 may have a thickness of about 25 to 300 micrometers (µm).

The adhesive layer 12 may be maintained to be attached to the thin film encapsulation layer 30 when a cell cutting process is performed and may be removed when a cell cutting process which will be described below is finished and another functional layer is attached. Accordingly, upper/lower limitations of adhesion strength are desirable. The adhesive layer may have adhesion strength of about 1 to 50 gf/inch when stainless steel (for example, steel use stainless, SUS) is an adherent. When the adhesive layer 12 has adhesion strength within this range, peeling of the upper passivation film 10/removal of the outskirt portion may be prevented or reduced when the cell cutting process is performed and/or damage (such as, for example, stripping of the surface layer) to the thin film encapsulation layer 30 may be reduced or prevented when the upper passivation film 10 is removed.

The adhesive layer 12 may have adhesion strength of 3.7 to 8.4 gf/inch when polyethylene terephthalate (PET) is the adherent.

The adhesive layer 12 may be a silicone, acrylic, or urethane-based low adhesive film.

Figure 5:
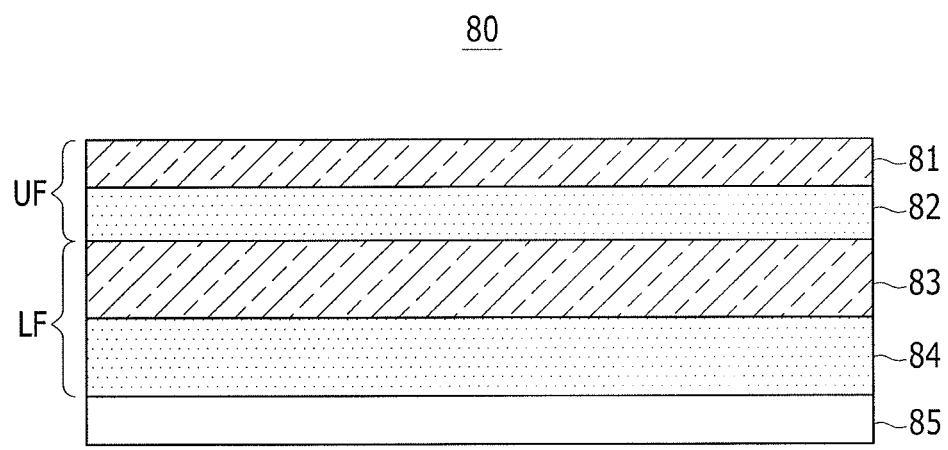
FIG. 5 illustrates a cross-sectional view of the upper passivation film according to another exemplary embodiment.

FIG. 5 illustrates a cross-sectional view of the upper passivation film 80 according to another exemplary embodiment. Referring to FIG. 5, an upper passivation film 80 may be constituted by a first carrier film 81, a first adhesive layer 82 formed on a lower portion of the first carrier film 81, a second carrier film 83 formed on a lower portion of the first adhesive layer 82, a second adhesive layer 84 formed on a lower portion of the second carrier film 83, and a release film (liner) 85 attached to a lower portion of the second adhesive layer 84.

The upper passivation film 80 may have a double structure including an upper film UF formed of the first carrier film 81 and the first adhesive layer 82 and a lower film LF formed of the second carrier film 83 and the second adhesive layer 84. The release film 85 may be a protection paper for preventing the second adhesive layer 84 from coming into contact with contaminants and with the outside. The release film 85 is removed before the upper passivation film 80 is attached to the thin film encapsulation layer 30 to attach the second adhesive layer 84 to the thin film encapsulation layer 30.

The first carrier film 81 and the second carrier film 83 may be formed of any one of polyethylene terephthalate (PET), polyethylene naphthalate (PEN), polyethylene sulfide (PES), and polyethylene (PE).

The second carrier film 83 may have a thickness of about 25 to 300 micrometers (μm).

The second adhesive layer 84 may have adhesion strength of about 1 to 50 gf/inch when stainless steel (steel use stainless, SUS) is the adherent, and may have adhesion strength of about 3.7 to 8.4 gf/inch when polyethylene terephthalate (PET) is the adherent. As described above, a modified structure of the upper passivation film 80 is a double structure.

Adhesion strength of the first adhesive layer 82 may be the same as or smaller than adhesion strength of the second adhesive layer 84. In another implementation, the first carrier film 81 and the second carrier film 83 may be attached due to attachment strength such as electrostatic force or surface tension without the first adhesive layer 82.

When the aforementioned upper passivation film 10 having the monolayer structure is used, scratches may occur due to equipment stage vacuum holes in equipment and performing of distribution, causing defects in visual alignment or hindering panel visual examination by equipment in a post-process. In the structure of the upper passivation film 80 of the present exemplary embodiment, the visual examination may be performed by removing the first carrier film 81.

Figure 6:
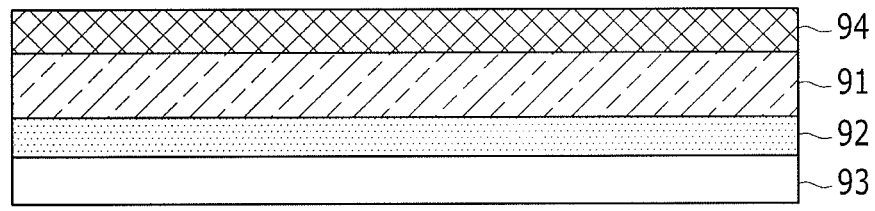
FIG. 6 illustrates a cross-sectional view showing formation of a hard coating layer on the upper passivation film according to yet another exemplary embodiment.

FIG. 6 illustrates a cross-sectional view showing formation of a hard coating layer on the upper passivation film according to yet another exemplary embodiment. Referring to FIG. 6, the hard coating layer 94 may be formed on the upper portion of the upper passivation film. FIG. 6 shows formation of the hard coating layer 94 on the single upper passivation film constituted by a carrier film 91, an adhesive layer 92, and a release film 93. However, it is to be understood that be structure in which the hard coating layer 94 is further included in the upper portion of the upper passivation film may be applied to all structures of the aforementioned single or double upper passivation film.

The hard coating layer 94 may be formed by applying an acryl-based urethane onto the surface of the carrier film 91 at the upper portion of the upper passivation film and then radiating the acryl-based urethane with ultraviolet rays (UV) to perform curing.

The hard coating layer 94 may have a thickness of about 3 to 4 micrometers (μm).

The hard coating layer 94 may prevent or hinder scratches from occurring in the carrier film 91 of the upper passivation film in equipment processing and performing of distribution. Like the upper passivation film, the hard coating layer 94 may be formed of a transparent material, and vision alignment or panel visual examination may be performed while the hard coating layer 94 and the upper passivation film are attached.

The method of manufacturing the display panel as shown in FIGS. 2E and 2F, following the process stages shown in FIGS. 2A to 2D, may further include removing the upper passivation film 10 from the thin film encapsulation layer 30 of the unit display panel 200 cut into the form of the cell unit (S105) and attaching a functional layer 70 to the thin film encapsulation layer 30 (S106).

The functional layer 70 may be a polarizer, a touch screen panel, or a light efficiency or brightness increasing film.

In the unit display panel 200 cut into the form of a cell unit, a selection range may be widened by removing the upper passivation film 10 and attaching the functional layer 70 to the thin film encapsulation layer 30 for the various purposes. For example, a polarizer or a touch screen panel may be attached to the organic light emitting display panel. Compared to a process in which a polarizer is attached at an early stage such that the polarizer is always attached onto the display panel, the present method allows for selectivity, for example, in attaching a touch screen panel instead of a polarizer.

Further, in addition to the polarizer or the touch screen panel, a light efficiency increasing film or a brightness increasing film may be attached in a cut state to the unit display panel 200 to increase the degree of freedom of the display panel structure. When the polarizer and the touch screen panel are attached to an undivided mother substrate, it may be difficult to directly manufacture the polarizer and the touch screen panel as the upper film because there may be great damage and loss in yield and area. On the other hand, when a temporary upper passivation film is used, according to embodiments, a large merit may be ensured in terms of the degree of freedom of the structure.

Figure 7:
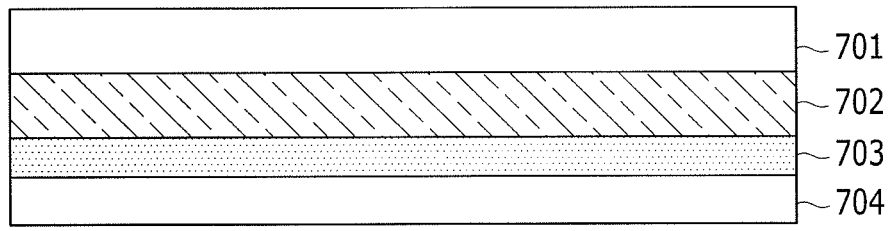
FIG. 7 illustrates a cross-sectional view of the upper passivation film according to yet another exemplary embodiment.

FIG. 7 illustrates a cross-sectional view of the upper passivation film 700 according to yet another exemplary embodiment. Referring to FIG. 7, the upper passivation film 700 itself may include a functional layer 702. The upper passivation film 700 may initially include a functional layer 702, a functional layer passivation film 701 formed on an upper portion of the functional layer 702, an adhesive layer 703 formed on a lower portion of the functional layer 702, and a release film 704 attached to a lower portion of the adhesive layer 703. The release film 704 may be removed to attach the adhesive layer to the thin film encapsulation layer 30.

The adhesive layer 703 may have adhesion strength of about 0.2 to 2 kgf/inch when stainless steel (steel use stainless (SUS)) is an adherent. The adhesive layer 703 may be a silicone, acrylic, or urethane-based low adhesive film.

The functional layer 702 may be a polarizer, a touch screen panel, or a light efficiency or brightness increasing film.

Figure 8:
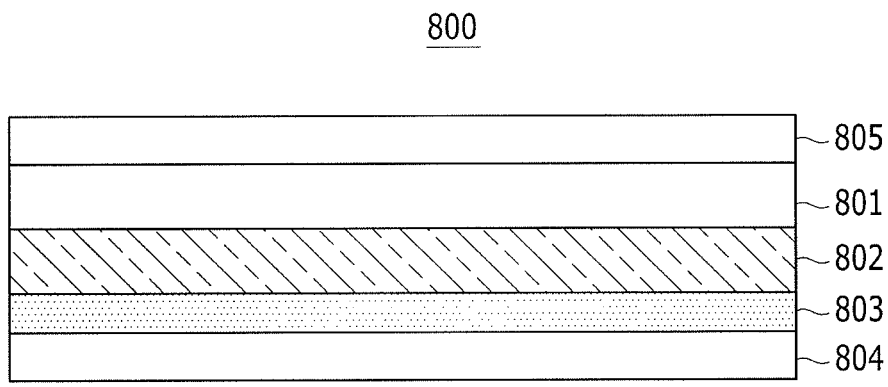
FIG. 8 illustrates a cross-sectional view of the upper passivation film according to still another exemplary embodiment.

FIG. 8 is a cross-sectional view of a upper passivation film 800 according to still another exemplary embodiment. Referring to FIG. 8, the upper passivation film 800 may further include a dummy passivation film 805 in addition to the upper passivation film 700 shown in FIG. 7. The upper passivation film 800 may initially be constituted by a functional layer 802, a functional layer passivation film 801 formed on the functional layer 802, a dummy passivation film 805 formed on an upper portion of the functional layer passivation film 801, an adhesive layer 803 formed on a lower portion of the functional layer 802, and a release film 804 attached to a lower portion of the adhesive layer 803. The release film 804 may be removed to attach the adhesive layer 803 to the thin film encapsulation layer 30.

The adhesive layer 803 may have adhesion strength of about 0.2 to 2 gf/inch when stainless steel (steel use stainless (SUS)) is the adherent. The adhesive layer 803 may be a silicone, acrylic, or urethane-based film. The functional layer 802 may be a polarizer, a touch screen panel, or a light efficiency or brightness increasing film.

Figure 9:
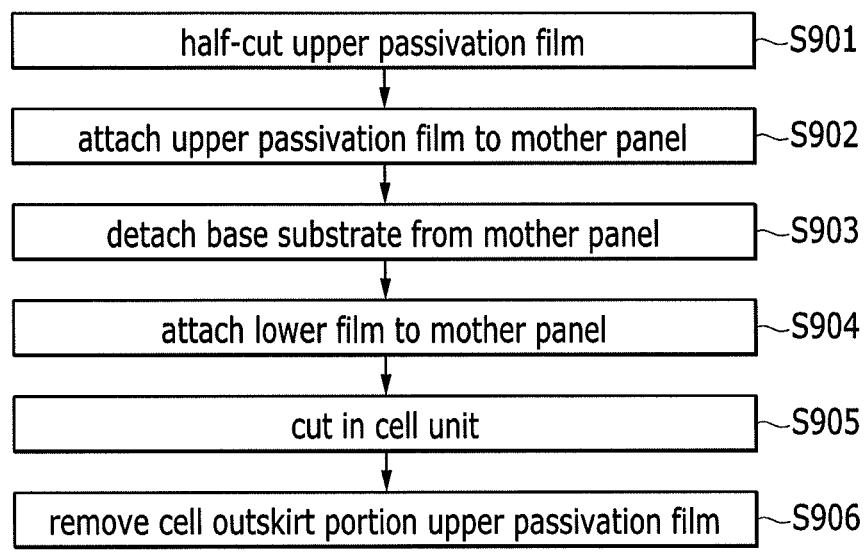
FIG. 9 illustrates a flowchart showing a method of manufacturing the display panel according to another exemplary embodiment.

FIG. 9 illustrates a flowchart showing a method of manufacturing the display panel according to another exemplary embodiment, and FIGS. 10A to 10F illustrate process views showing stages of the method of manufacturing the display panel according to this exemplary embodiment.

Referring to FIGS. 9 and 10A to 10F, first, a mother panel 1000 including a thin film encapsulation layer 130 encapsulating a display substrate 140 on which a display device layer 150 is formed is provided on a base substrate 120. An outskirt portion of the display substrate 140 may be exposed and a pad portion may be formed at the outskirt portion of the display substrate 140. Accordingly, the pad portion may be opened to the outside after cell cutting.

Figure 10A:
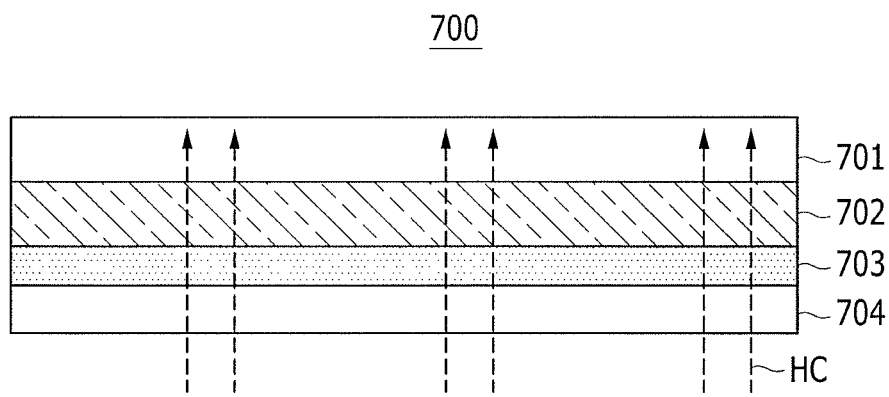
FIGS. 10A to 10F illustrate process views showing each step of the method of manufacturing the display panel according to another exemplary embodiment.
Figure 10B:
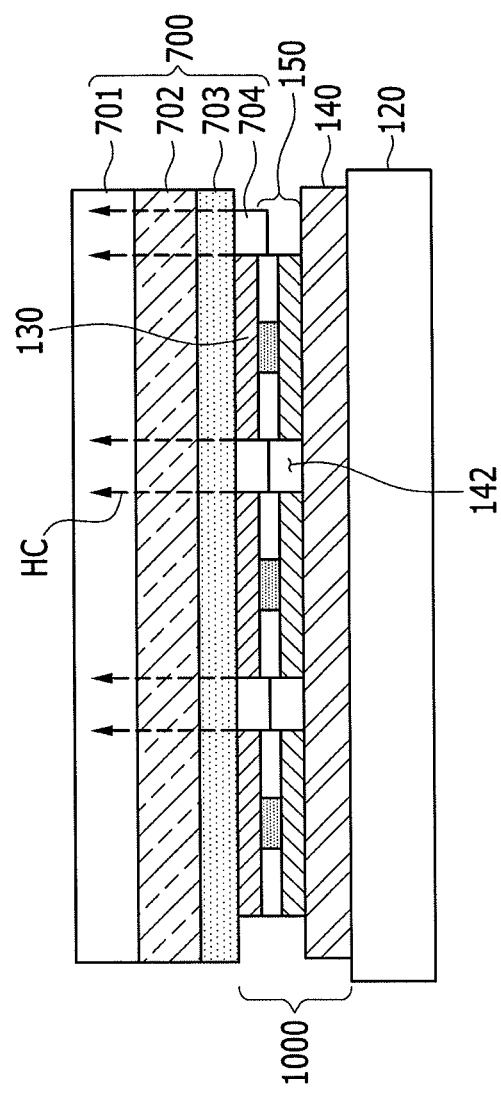

As shown in FIGS. 10A and 10B, half cutting may be performed such that the functional layer 702, the adhesive layer 703, and the release film 704 remain on the cell outskirt portion 142 other than a surface of the upper passivation film 700, on which the display device layer 150 is formed (S901). In this case, a half cutting line HC may be cut to only a portion of a thickness of the functional layer passivation film 701 in view of a cross-section to remove the release film 704, the adhesive layer 703, the functional layer 702, and the functional layer passivation film 701 of the cell outskirt portion 142 together after cutting the mother panel 1000 into the unit display panel 2000. Cutting may be performed such that the release film 704 remains on the cell outskirt portion 142, Accordingly, two half cutting lines HC may be formed on respective sides of the unit display panel 2000 based on the cell outskirt portion 142.

As shown in FIG. 10B, the release film of the surface on which the display device layer 150 is formed may be removed, and the half cut upper passivation film 700 may be attached to the thin film encapsulation layer 130 (S902). The adhesive layer 703 of the upper passivation film 700 may be attached to the thin film encapsulation layer 130 corresponding to the display device layer 150.

Figure 10C:
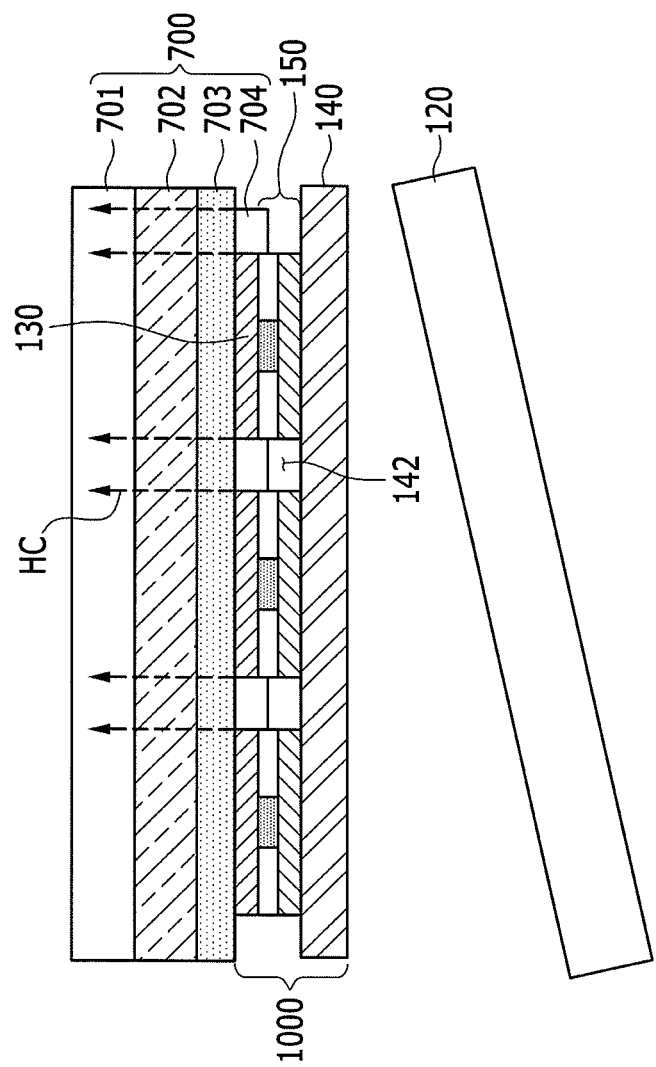

As shown in FIG. 10C, the base substrate 120, which may provide sufficient thickness to enable convenient handling of the mother panel 1000, may be detached from the display substrate (S903).

Figure 10D:
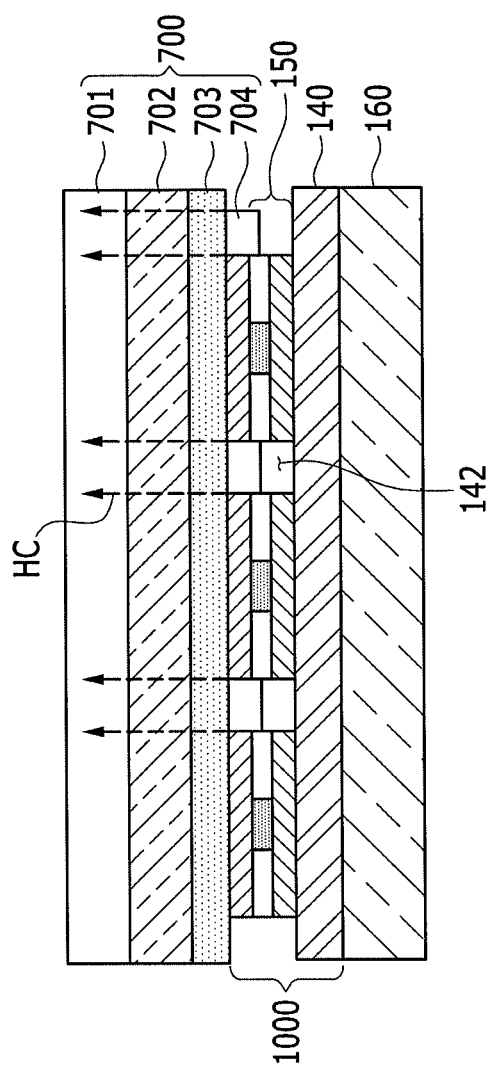

As shown in FIG. 10D, the lower film 160 may be attached to the display substrate after the base substrate 120 is detached (S904). The lower film 160 may be attached to the display substrate to prevent a surface of the display substrate from being damaged when an additional process is performed.

Figure 10E:
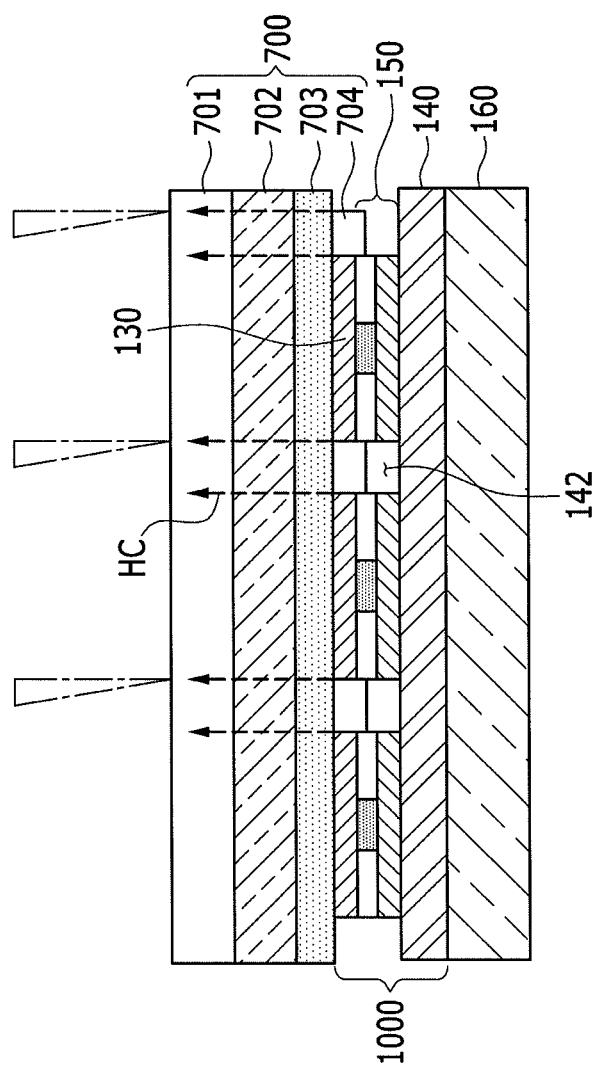

As shown in FIG. 10E, the mother panel 1000 to which the upper passivation film 700 and the lower film 160 are attached is cut to provide a unit display panel 2000 (S905). The cell cutting may be performed using a method such as laser cutting or cutting by a physical unit (e.g., knife). The half cutting line HC including the surface on which the display device layer 150 is formed and the cell outskirt portion 142 is cut among the two half cutting lines HC formed on both sides based on the cell outskirt portion 142.

Figure 10F:
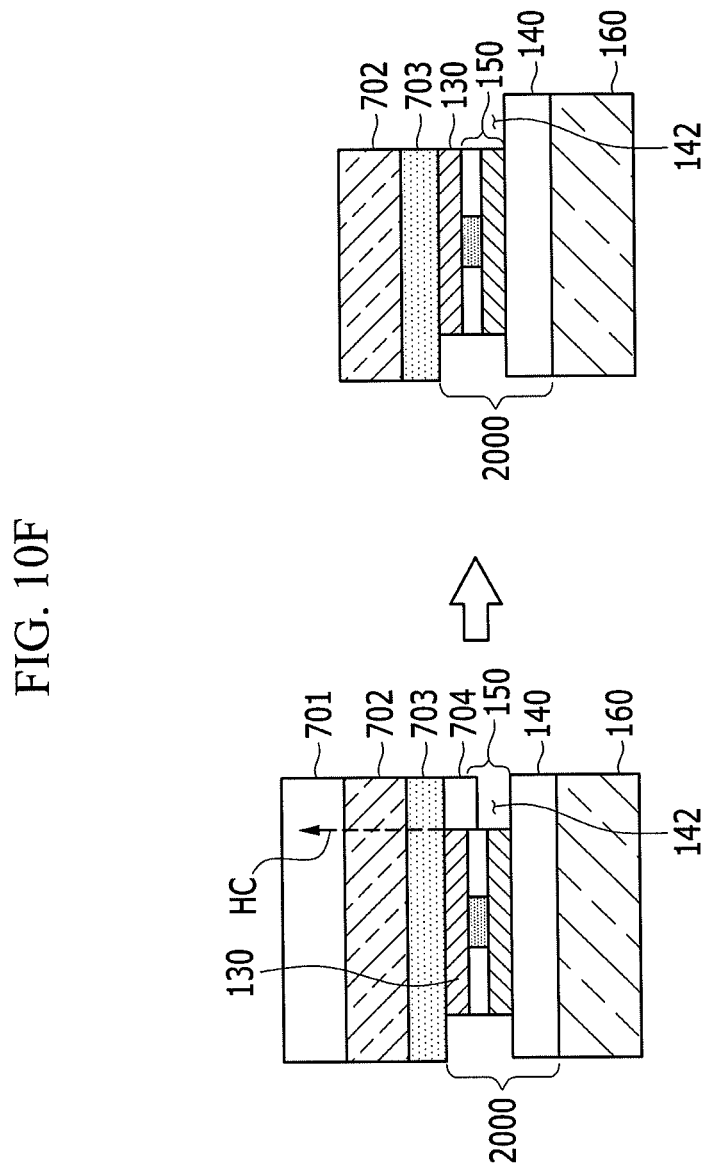

Thereafter, as shown in FIG. 10F, in the unit display panel 2000 cut into the form of a cell unit, the upper passivation film 700 at the cell outskirt portion 142 is removed (S906). The functional layer passivation film 701 formed on the upper portion of the functional layer 702, and the functional layer 702, the adhesive layer 703, and the release film 704 of the cell outskirt portion 142 are removed (S906). As described above, the functional layer 702, the adhesive layer 703, and the release film 704 may be cut in advance along another half cutting line HC among the two half cutting lines formed on both sides based on the cell outskirt portion 142. Accordingly, when the functional layer passivation film 701 is peeled off, the functional layer 702, the adhesive layer 703, and the release film 704 of the cell outskirt portion 142 may be easily removed.

The removing of the upper passivation film of the cell outskirt portion (S906) may be performed such that end surfaces of the functional layer 702 corresponding to the surface on which the display device layer 150 is formed and the adhesive layer 703 coincide with an end surface of the display device layer 150.

The upper passivation film 700 shown in FIGS. 9 and 10A to 10F may further include a dummy passivation film on the functional layer passivation film 701. The functional layer 702 may be a polarizer, a touch screen panel, or a light efficiency or brightness increasing film. Adhesion strength of the adhesive layer 703 may be changed by irradiating the adhesive layer with ultraviolet rays (UV). When the release film 704 remains on the cell outskirt portion 142, bubbles may be generated due to a step. In order to prevent the generation of bubbles, the adhesive layer 703 may be obtained using a material changing adhesion strength using ultraviolet rays (UV) to remove the step.

By way of summation and review, a display device may typically include a thin film transistor, a display substrate including an emission layer, and an encapsulation substrate covering the display substrate. In the case of an organic light emitting diode display, the display substrate is encapsulated using thin film glass in order to prevent moisture and oxygen from penetrating an organic material that is a light emitting body. In a flexible OLED display, a thin film encapsulation process is used. However, in a thin film encapsulation layer, damages such as stab marks or scratches may easily occur due an alien substance generated by external scratching or when a process such as a cutting process is performed, thus causing defects such as dark spots on the display.

Embodiments may improve productivity, a process ability, and a yield by providing a method in which an upper passivation film is attached onto a thin film encapsulation layer on a substrate in the original substrate state and then subsequent processes are performed to manufacture a display panel.

As described above, by the method of manufacturing the display panel according to the exemplary embodiment, it may be easy to handle the display panel in equipment and movement of automation distribution and it may be possible to protect the thin film encapsulation layer to prevent damages such as stabbing or scratches by an alien substance generated by external scratching or when a process is performed by attaching the upper passivation film to the thin film encapsulation layer and performing the process. Further, it may be possible to perform inspection of the display panel and confirm process marks in equipment by using a transparent material as the upper passivation film. Accordingly, limitations in equipment/performing of the process may be reduced or eliminated. Further, after the upper passivation film is removed, a functional layer such as a touch screen panel or a light efficiency or brightness increasing film may be attached. Thus, a degree of freedom of the display panel structure may be increased.

Further, it is possible to reduce or remove a possibility of an occurrence of defects by constituting the upper passivation film to have the functional layer and maintaining the upper passivation film on the thin film encapsulation layer to affect a physical structure of the device according to removal of the upper passivation film.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A method of manufacturing a display panel, the method comprising:
    forming a mother panel on a base substrate;
    attaching an upper passivation film to the mother panel;
    detaching the base substrate from the mother panel;
    attaching a lower film to the mother panel; and
    cutting the mother panel to which the upper passivation film and the lower film are attached to form the display panel by laser cutting, the display panel being in a form of a cell unit, wherein the display panel includes a display substrate, a display device layer, and a thin film encapsulation layer, and wherein:
    the thin film encapsulation layer includes a first inorganic layer, a second inorganic layer and at least one organic layer between the first inorganic layer and the second inorganic layer,
    the display panel includes a halogenated metal layer between the display device layer and the first inorganic layer, and
    the upper passivation film initially includes a first carrier film, a first adhesive layer on a lower portion of the first carrier film, and a release film attached to a lower portion of the first adhesive layer, and the method includes:
    removing the release film to attach the first adhesive layer to the thin film encapsulation layer, the first adhesive layer having an adhesion strength of about 1 to 50 gf/inch when stainless steel (SUS) is an adherent.

2. The method of manufacturing a display panel as claimed in claim 1, wherein the carrier film is formed of any one of polyethylene terephtalate, polyethylene naphthalate, polyethylene sulfide, or polyethylene.

3. The method of manufacturing a display panel as claimed in claim 1, wherein the carrier film has a thickness of about 25 to 300 μm.

4. The method of manufacturing a display panel as claimed in claim 1, wherein the adhesive layer is a silicone, acrylic, or urethane-based film.

5. The method of manufacturing a display panel as claimed in claim 1, wherein:
    the upper passivation film initially includes a second adhesive layer formed on a lower portion of a second carrier film and on an upper portion of the first carrier film.

6. The method of manufacturing a display panel as claimed in claim 5, wherein the first carrier film and the second carrier film are formed of any one of polyethylene terephthalate, polyethylene naphthalate, polyethylene sulfide, or polyethylene.

7. The method of manufacturing a display panel as claimed in claim 5, wherein the first carrier film has a thickness of about 25 to 300 μm.

8. The method of manufacturing a display panel as claimed in claim 5, wherein the first adhesive layer and the second adhesive layer are each individually a silicone, acrylic, or urethane-based film.

9. The method of manufacturing a display panel as claimed in claim 5, wherein an adhesion strength of the second adhesive layer is the same as or smaller than the adhesion strength of the first adhesive layer.

10. The method of manufacturing a display panel as claimed in claim 1, further comprising forming a hard coating layer on an upper portion of the upper passivation film.

11. The method of manufacturing a display panel as claimed in claim 10, wherein the hard coating layer has a thickness of about 3 to 4 μm.

12. The method of manufacturing a display panel as claimed in claim 10, wherein the hard coating layer is formed by applying an acryl-based urethane onto the upper portion of the upper passivation film and then performing ultraviolet (UV) curing.

13. The method of manufacturing a display panel as claimed in claim 1, wherein the display substrate is a flexible substrate.

14. The method of manufacturing a display panel as claimed in claim 1, wherein the upper passivation film is formed of a transparent material.

15. The method of manufacturing a display panel as claimed in claim 1, further comprising:
    removing the upper passivation film from the thin film encapsulation layer of the display panel in the form of the cell unit; and
    attaching a functional layer to the thin film encapsulation layer.

16. The method of manufacturing a display panel as claimed in claim 15, wherein the functional layer is a polarizer.

17. The method of manufacturing a display panel as claimed in claim 15, wherein the functional layer is a touch screen panel.

18. The method of manufacturing a display panel as claimed in claim 15, wherein the functional layer is a light efficiency or brightness increasing film.

19. The method of manufacturing a display panel as claimed in claim 1, wherein the upper passivation film initially includes a functional layer, a functional layer passivation film formed on an upper portion of the functional layer, an adhesive layer formed on a lower portion of the functional layer, and a release film attached to the lower portion of the adhesive layer, and the method includes removing the release film to attach the adhesive layer to the thin film encapsulation layer.

20. The method of manufacturing a display panel as claimed in claim 19, further comprising, before attaching the upper passivation film to the mother panel, performing half-cutting such that when the upper passivation film is attached to the mother panel, the functional layer, the adhesive layer, and the release film remain on a cell outskirt portion other than a surface on which the display device layer is formed.

21. The method of manufacturing a display panel as claimed in claim 20, further comprising: after cutting the mother panel to form the display panel in the form of the cell unit, removing the functional layer passivation film, the functional layer, the adhesive layer, and the release film from the cell outskirt portion.

22. The method of manufacturing a display panel as claimed in claim 21, wherein: the removing the functional layer passivation film, the functional layer, the adhesive layer, and the release film from the cell outskirt portion is performed such that end surfaces of the functional layer corresponding to the surface on which the display device layer is formed and the adhesive layer coincide with an end surface of the display device layer.

23. The method of manufacturing a display panel as claimed in claim 19, wherein the functional layer is a polarizer.

24. The method of manufacturing a display panel as claimed in claim 19, wherein the functional layer is a touch screen panel.

25. The method of manufacturing a display panel as claimed in claim 19, wherein the functional layer is a light efficiency or brightness increasing film.

26. The method of manufacturing a display panel as claimed in claim 19, wherein the upper passivation film further includes a dummy passivation film on the functional layer passivation film.

27. The method of manufacturing a display panel as claimed in claim 19, wherein an adhesion strength of the adhesive layer is changed by ultraviolet rays (UV).

* * * * *